(12) United States Patent
Li

(10) Patent No.: US 9,978,741 B2
(45) Date of Patent: May 22, 2018

(54) HIGH VOLTAGE ESD DEVICE FOR FINFET TECHNOLOGY

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days. days.

(21) Appl. No.: 15/334,130

(22) Filed: Oct. 25, 2016

(65) Prior Publication Data

US 2017/0287897 A1    Oct. 5, 2017

(30) Foreign Application Priority Data

Mar. 29, 2016  (CN) .......................... 2016 1 0185829

(51) Int. Cl.
  *H01L 27/02*    (2006.01)
  *H01L 23/535*    (2006.01)
  (Continued)

(52) U.S. Cl.
  CPC ........ *H01L 27/0266* (2013.01); *H01L 23/535* (2013.01); *H01L 27/0255* (2013.01);
  (Continued)

(58) Field of Classification Search
  None
  See application file for complete search history.

(56) References Cited

U.S. PATENT DOCUMENTS

2014/0131765 A1   5/2014   Tsai et al.
2015/0194419 A1   7/2015   Singh et al.

FOREIGN PATENT DOCUMENTS

CN         104576732        4/2015

OTHER PUBLICATIONS

European Application No. 17162365.5, Extended European Search Report dated Jul. 31, 2017, 6 pages.
(Continued)

*Primary Examiner* — Duy T Nguyen
*Assistant Examiner* — Bo Bin Jang
(74) *Attorney, Agent, or Firm* — Kilpatrick Townsend & Stockton LLP

(57) ABSTRACT

An ESD protection device includes a semiconductor substrate, first and second fins, first and second doped regions adjacent to each other and having different conductivity types. The first doped region includes a first portion of the substrate and a first region of the first fin. The second doped region includes a second portion of the substrate and a second region of the first fin. The device also includes a first gate structure on a portion of first and second regions of the first fin, a first highly doped region in the first region of the first fin and having a same conductivity type as the first doped region, and a dopant concentration higher than the first doped region, and a second highly doped region in the second fin and having a same conductivity type as the second doped region, and a dopant concentration higher than the second doped region.

20 Claims, 3 Drawing Sheets

(51) Int. Cl.
  *H01L 29/06* (2006.01)
  *H01L 29/36* (2006.01)
  *H01L 29/78* (2006.01)
  *H01L 29/739* (2006.01)

(52) U.S. Cl.
  CPC .......... *H01L 29/0649* (2013.01); *H01L 29/36* (2013.01); *H01L 29/7391* (2013.01); *H01L 29/785* (2013.01); *H01L 29/0653* (2013.01)

(56) References Cited

OTHER PUBLICATIONS

Thijs et al., On gated diodes for ESD protection in bulk FinFET CMOS technology, Electrical Overstress/Electrostatic Discharge Symposium (EOS/ESD), 33rd, Sep. 11, 2011, pp. 1-8.

ize: small;">#  HIGH VOLTAGE ESD DEVICE FOR FINFET TECHNOLOGY

CROSS-REFERENCES TO RELATED APPLICATIONS

This application claims priority to Chinese patent application No. 201610185829.2, filed on Mar. 29, 2016, the content of which is incorporated herein by reference in its entirety.

FIELD OF THE INVENTION

The present disclosure generally relates to semiconductor technology, and more particularly to electrostatic discharge (ESD) protection circuitry and semiconductor devices.

BACKGROUND OF THE INVENTION

Semiconductor integrated circuits are subject to serious damage caused by ESD events. As semiconductor features continue to decrease in sizes, supply voltages also continue to decrease. In relatively low power supply voltages (e.g., less than 6 V), shallow trench isolation (STI) diodes and gate-controlled diodes can be used as ESD protection devices. In relatively high power supply voltages (e.g., more than 6 V), gate-grounded N-type MOS (GGNMOS) transistors can be used as ESD protection devices.

However, for fin-type field effect transistor (FinFET) devices, the amount of generated hot carriers due to the small-size fin is insufficient to effectively trigger a GNNMOS transistor. Thus, there is a need for a novel ESD protection structure for high voltage applications and method for manufacturing the same.

BRIEF SUMMARY OF THE INVENTION

Embodiments of the present disclosure provide an electrostatic discharge (ESD) protection device. The ESD protection device includes a substrate structure having a semiconductor substrate, a plurality of fins on the semiconductor substrate and having a first fin and a second fin, a first doped region and a second doped region laterally adjacent to each other and having different conductivity types. The first doped region includes a first portion of the semiconductor substrate and a first region of the first fin on the first portion of the semiconductor substrate. The second doped region includes a second portion of the semiconductor substrate, a second region of the first fin on the second portion of the semiconductor substrate, and the second fin on the second doped region. The ESD protection device also includes a first gate structure on a portion of a first region of the first fin and on a portion of a second region of the first fin, a first highly doped region in the first region of the first fin and having a same conductivity type as the first doped region, and a dopant concentration of the first highly doped region being higher than a dopant concentration of the first doped region, and a second highly doped region in the second fin and having a same conductivity type as the second doped region, and a dopant concentration of the second highly doped region being higher than a dopant concentration of the second doped region.

In one embodiment, the ESD protection device further includes a signal input terminal configured to receive an external signal. The first highly doped region is electrically connected to a gate of the first gate structure, and the second highly doped region is electrically connected to the signal input terminal.

In one embodiment, he first doped region is doped with an N-type dopant, the second doped region is doped with a P-type dopant, and the first highly doped region and the gate of the first gate structure are connected to a power supply voltage.

In one embodiment, the first doped region is doped with a P-type dopant, the second doped region is doped with an N-type dopant, and the first highly doped region and the gate of the first gate structure are connected to a ground potential.

In one embodiment, the first gate structure is disposed on a portion of the first region of the first fin, and on an upper surface and a side surface of the second region of the first fin.

In one embodiment, the first gate structure is disposed on a portion of the first region of the first fin and on the second region of the first fin.

In one embodiment, the ESD protection device further includes a shallow trench isolation (STI) region in the second doped region and between two adjacent fins.

In one embodiment, the first gate structure is disposed on a portion of the first region of the first fin, on an upper surface and a side surface of the second region of the first fin, and on a portion of the STI region.

In one embodiment, the ESD protection device further includes a dummy gate structure on a distal end portion of the second fin and on the STI region to define an opening in the second highly doped region.

In one embodiment, the first gate structure includes an interface layer on a portion of the first region of the first fin and on a portion of the second region of the first fin, spacers on the first fin and adjacent to opposite sides of the interface layer, a high-k dielectric layer on the interface layer and on inner sidewalls of the spacers, and a gate on the high-k dielectric layer.

In one embodiment, the ESD protection device also includes a first dummy gate structure on a distal end portion of the first region of the first fin that is not covered by the first gate structure to define an opening in the first highly doped region. The first dummy gate structure includes an interface layer on a distal end portion of the first region of the first fin that is not covered by the first gate structure, first spacers on opposite sides of the first dummy gate structure and adjacent to opposite sides of the interface layer, a high-k dielectric layer on the interface layer and on inner sidewalls of the first spacers, and a first dummy gate on the high-k dielectric layer.

In one embodiment, the ESD protection device further includes a second dummy gate structure. The second dummy gate structure includes the interface layer on opposite distal ends of the second fin, second spacers on the STI region and on the distal ends of the second fin, the high-k dielectric layer on the interface layer and on inner sidewalls of the second spacers; and a second dummy gate on the high-k dielectric layer.

In one embodiment, the first and second highly doped regions comprise SiGe, SiC, or Si.

In one embodiment, the fins further includes a third fin, the substrate structure further includes a third doped region adjacent the second doped region, the second and third regions having different conductivity types, the third doped region includes a third portion of the semiconductor substrate and a first region of the third fin, the second doped region further includes a second region of the third fin, the second region of the third fin is adjacent to the first region of the third fin. The substrate structure further includes a third highly doped region disposed in the first region of the third fin and having a same conductivity type of the third doped region, and a conductivity type concentration of the third highly doped region higher than a conductivity type concentration of the third doped region.

In one embodiment, the first highly doped region is electrically connected to a gate of the first gate structure, and the second highly doped region is electrically connected to the signal input terminal, and the third highly doped region is electrically connected to a gate of the second gate structure.

Embodiments of the present disclosure also provide a semiconductor device including at least one ESD protection device as described above. The at least one ESD protection device may include a first ESD protection device and a second ESD protection device. The first doped region of the first ESD protection device includes an N-type dopant, the second doped region of the first ESD device includes a P-type dopant, the first highly doped region and a gate of the first gate structure of the first ESD protection device are electrically connected to a power supply voltage. The first doped region of the second ESD protection device includes a P-type dopant, the second doped region of the second ESD protection device includes an N-type dopant, the first highly doped region and a gate of the first gate structure of the second ESD protection device are electrically connected to a ground potential. The second highly doped region of the first ESD protection device is electrically connected to the second highly doped region of the second ESD protection device, and the second highly doped region of the first ESD protection device and the second highly doped region of the second ESD protection device are connected to a signal input terminal configured to receive an external signal.

In one embodiment, the semiconductor device further includes an internal circuit electrically connected to the signal input terminal for receiving the external signal. The internal circuit includes a metal oxide semiconductor (MOS) transistor having a gate connected to the signal input terminal.

The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
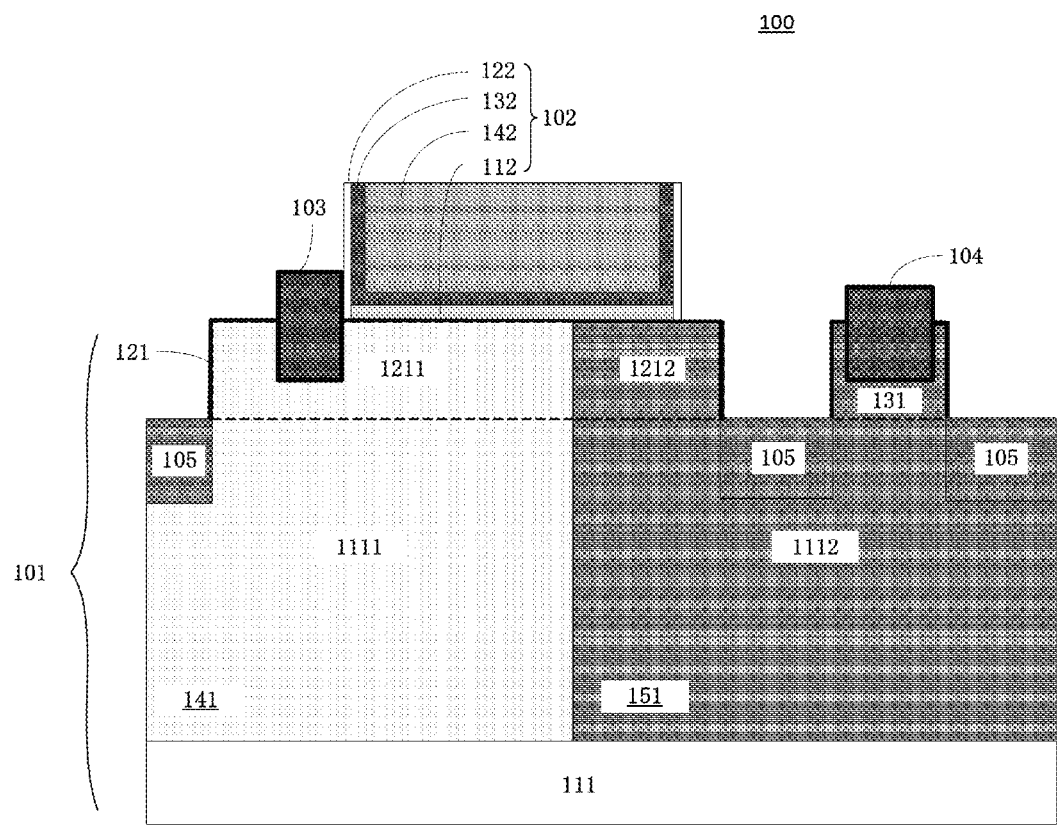
FIG. 1 is a cross-sectional view illustrating an ESD protection device according to some embodiments of the present disclosure.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to perspective cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The use of the terms first, second, third, etc. do not denote any order, but rather the terms first, second, third, etc. are used to distinguish one element from another. Furthermore, the use of the terms a, an, etc. does not denote a limitation of quantity, but rather denote the presence of at least one of the referenced items.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

In accordance with some embodiments of the present disclosure, an ESD protection device is provided for high voltage applications. FIG. 1 is a cross-sectional view illustrating an ESD protection device 100 according to some embodiments of the present disclosure. ESD protection device 100 may include a substrate structure 101. Substrate structure 101 includes a semiconductor substrate (e.g. silicon substrate) 111 and a plurality of semiconductor fins adjacent the semiconductor substrate. The semiconductor fins include a first fin 121 and a second fin 131. It should be noted that the bottom surface of first fin 121 and second fin 131 cannot actually be seen. However, for the convenience of explanation and for clarity reason, the bottom surface of first fin 121 and second fin 131 is indicated by a dotted line in the drawings.

Substrate structure 101 includes a first doped region 141 laterally adjacent to second doped region 151, first doped region 141 and second doped region 151 have different conductivity types. First doped region 141 includes a first portion 1111 of semiconductor substrate 111 and a first region 1211 of first fin 121 on first portion 1111. Second doped region 151 includes a second portion 1112 of semiconductor substrate 111 and a second region 1212 of first fin 121 on second portion 1112 of semiconductor substrate 111. Second region 1212 of first fin 121 is adjacent to first region 1211 of the first fin.

As shown in FIG. 1, ESD protection device 100 also includes a first gate structure 102 on at least a portion of first region 1211 of first fin 121 and on at least a portion of second region 1212 of first fin 121. In one embodiment, first gate structure 102 includes an interface layer (e.g., silicon oxide layer) 112 on at least a portion of first region 1211 and on at least a portion of second region 1212 of first fin 121, spacers 122 (e.g., silicon oxide or silicon nitride layer) on first fin and adjacent to interface layer 112, a high-k dielectric layer 132 on interface layer 112 and inner sidewalls of spacers 122, and a gate (e.g., a metal or polysilicon gate) 142 on high-k dielectric layer 132. Those skilled in the art will appreciate that first gate structure 102 is not limited thereto. For example, first gate structure 102 may also includes additional layers or fewer layers.

ESD protection device 100 further includes a first highly doped region 103 and a second highly doped region 104. First highly doped region 103 is in first region 1211 of first fin 121 and has the same conductivity type as that of first doped region 141 and has a dopant concentration higher that that of first doped region 141. Second highly doped region 104 is in second fin 131 and has the same conductivity type as that of second doped region 151 and has a dopant concentration higher that that of second doped region 151. It should be understood that, first highly doped region 103 disposed in first region 1211 of first fin 121 may also include the case that a portion of the first highly doped region is located in the first region of the first fin, as shown in FIG. 1. Similarly, second highly doped region 104 disposed in second fin 131 may also include the case that a portion of the second highly doped region is located in the second fin. In an exemplary embodiment, the first and second highly doped regions may include silicon germanium (SiGe), silicon carbide (SiC), or silicon (Si). For example, the first and second highly doped regions may comprise a material selected from the group consisting of SiGe, SiC, or Si. As used herein, the term "highly doped" or "heavily doped" refers to a dopant concentration that may be greater than about $1.0 \times 10^{19}$ atoms/cm$^3$. For example, the highly doped or heavily doped region may have N-type or P-type dopants in a concentration greater than $1.0 \times 10^{19}$ atoms/cm$^3$.

In an embodiment, ESD protection device 100 may further include a shallow trench insulating (STI) region 105 disposed in the second doped region and between two adjacent fins. In a specific embodiment, STI region 105 may be located in second portion 1112 of semiconductor substrate 111. Further, STI region 105 may be located in first doped region 141 between two adjacent fins. More specifically, STI region 105 may be located in first portion 1111 of semiconductor substrate 111.

In the embodiment, the structure of the ESD protection device is similar to the structure of a laterally diffused metal oxide semiconductor (LDMOS) device, with the difference that the first highly doped region and the second highly doped region of the ESD protection device of the present disclosure have different conductivity types.

In specific applications, first highly doped region 103 of the ESD protection device of FIG. 1 may be electrically connected to gate 142 of the first gate structure, second highly doped region 104 may be electrically connected to a signal input terminal configured to receive an external signal. The external signal may enter the-to-be protected internal circuit through the signal input terminal. That is, the ESD protection device may be provided at a location in front of the internal circuit.

The different conductivity types of first doped region 141 and second doped region 151 enable the ESD protection device to provide different protections. The different protections of the combinations of the ESD protection devices will be described in different embodiments below.

In one embodiment, first doped region 141 includes an N-type conductivity material, and second doped region 151 includes a P-type conductivity material. At this time, first highly doped region 103 includes an N$^+$-type conductivity material, and second highly doped region 104 includes a P$^+$-type conductivity material. In this case, first highly doped region 103 and gate 142 of the first gate structure are electrically connected to power supply voltage (VDD), second highly doped region 104 is electrically connected to an external signal received through the signal input terminal. The ESD protection device of the present disclosure is similar to a LDPMOS device. When a negative voltage pulse of the external signal is less than a first predetermined threshold value, i.e., when second highly doped region 104 has a negative excess charge, the ESD protection device will turn on, the negative charge will move from the PN junction between first doped region 141 and second doped region 151 toward first highly doped region 103, so that a current flows from first highly doped region 103 to second highly doped region 104, so that the negative voltage pulse of the external signal (less than the first predetermined threshold value) is not directly applied to the internal circuit, thus providing protection to the internal circuit.

In another embodiment, first doped region 141 includes a P-type conductivity material, and second doped region 151 includes an N-type conductivity material. At this time, first highly doped region 103 includes a P$^+$-type conductivity material, and second highly doped region 104 includes an N$^+$-type conductivity material. In this case, first highly doped region 103 and gate 142 of the first gate structure are electrically connected to a ground potential (VSS), second highly doped region 104 is electrically connected to an external signal received through the signal input terminal. The ESD protection device of the present disclosure is similar to an LDNMOS device. When a positive voltage pulse of the external signal is greater than a second predetermined threshold value, i.e., when second highly doped region 104 has a positive excess charge, the ESD protection device will turn on, the positive charge will move from the PN junction between first doped region 141 and second doped region 151 toward first highly doped region 103, so that a current flows from first highly doped region 103 to second highly doped region 104, so that the positive voltage pulse of the external signal (greater than the second predetermined threshold value) is not directly applied to the internal circuit, thus providing protection to the internal circuit.

Figure 2:
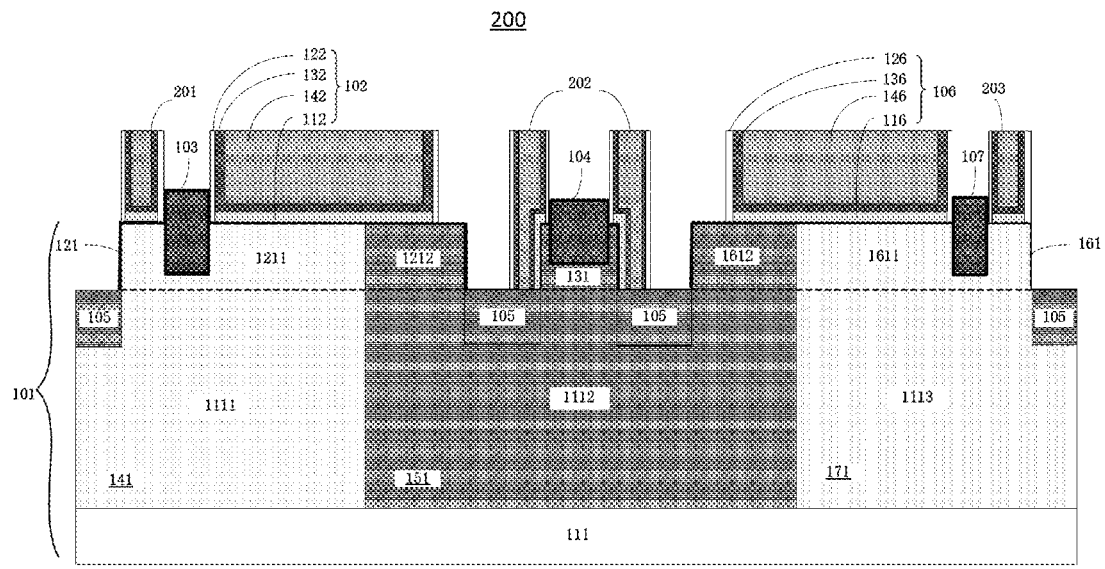
FIG. 2 is a cross-sectional view illustrating an ESD protection device according to other embodiments of the present disclosure.

FIG. 2 is a cross-sectional view illustrating an ESD protection device 200 according to another embodiment of the present disclosure. ESD protection device 200 may include a substrate structure 101. Substrate structure 101 includes a semiconductor substrate (e.g. silicon substrate) 111 and a plurality of semiconductor fins adjacent the semiconductor substrate. The semiconductor fins include first fin 121, second fin 131, and a third fin 161 that is separated from second fin 131. Substrate structure 101 also includes a third doped region 171 adjacent to second doped region 151. Third doped region 171 and second doped region 151 are of different conductivity types. In the embodiment, third doped region 171 includes a third portion 1113 of substrate 111 and a first region 1611 of third fin 161 on third portion 1113. Comparing with embodiment of FIG. 1, second doped region 151 also includes a second region 1612 of third fin 161 on second portion 1112. Second region 1612 of third fin 161 is adjacent to first region 1611 of third fin 161.

As shown in FIG. 2, ESD protection device 200 also includes a second gate structure 106 disposed on a portion of first region 1611 of third fin 161 and on at least one portion of second region 1612 of third fin 161. In an embodiment, second gate structure 106 and first gate structure 102 have a similar structure. Specifically, second gate structure 106 includes an interface layer (e.g., a silicon oxide layer) 116 on at least one portion of first region 1611 and on at least one portion of second region 1612 of third fin 161, spacers 126 on interface layer 116, a high-k dielectric layer 136 on interface layer 116 and on inner sidewalls of spacers 126, and a gate 146 on high-k dielectric layer 136. Those skilled in the art will appreciate that second gate structure 106 is not limited thereto. For example, second gate structure 106 may also includes more or fewer layers.

Referring still to FIG. 2, ESD protection device 200 also includes a third highly doped region 107 disposed in first region 1611 of third fin 161 and having the same conductivity type as that of third doped region 171 and a dopant concentration higher that the dopant concentration of third doped region 171.

In specific applications, first highly doped region 103 of the ESD protection device of FIG. 2 may be electrically connected to gate 142 of the first gate structure, second highly doped region 104 may be electrically connected to a signal input terminal configured to receive an external signal, third highly doped region 107 may be electrically connected to gate 146 of the second gate structure.

The working principle of ESD protection device 200 of FIG. 2 will be described below.

When first doped region 141 is doped with an N-type dopant, second doped region 151 is doped with a P-type dopant, and third doped region 171 is doped with an N-type dopant, then first highly doped region 103 and third highly doped region 107 each are heavily doped with an $N^+$-type dopant, and second highly doped region 104 is heavily doped with a $P^+$-type dopant. First highly doped region 103 and first gate electrode structure 142 may be electrically connected to the power supply voltage VDD, second highly doped region 104 may be electrically connected to the signal input terminal, third highly doped region 107 and second gate structure 146 may be electrically connected to the power supply voltage VDD. When a negative pulse voltage of the external signal is less than a predetermined threshold voltage value, i.e., when second highly doped region 104 has an excess negative charge, the ESD protection device will turn on, the excess negative charge will move through the PN junction between second doped region 151 and first doped region 141 and the PN junction between second doped region 151 and third doped region 171 toward first highly doped region 103 and third highly doped region 107, so that a current flows from first highly doped region 103 and third highly doped region 107 toward second highly doped region 104, thus preventing that the negative pulse voltage, which is less than the predetermined threshold voltage, from being directly applied to the internal circuit, thus providing a protection to the internal circuit.

When first doped region 141 is doped with a P-type dopant, second doped region 151 is doped with an N-type dopant, and third doped region 171 is doped with a P-type dopant, then first highly doped region 103 and third highly doped region 107 each are heavily doped with a $P^+$-type dopant, and second highly doped region 104 is heavily doped with an $N^+$-type dopant. First highly doped region 103 and first gate electrode structure 142 may be electrically connected to the ground potential VSS, second highly doped region 104 may be electrically connected to the signal input terminal for receiving an external signal, third highly doped region 107 and second gate structure 146 may be electrically connected to the ground potential VSS. When a positive pulse voltage of the external signal is greater than a predetermined voltage value, i.e., when second highly doped region 104 has an excess positive charge, the ESD protection device will open, the positive charge will move through the PN junction between first doped region 141 and second doped region 151 and the PN junction between third doped region 171 and second doped region 151 toward first highly doped region 103 and third highly doped region 107, so that a current flows from second highly doped region 104 toward first highly doped region 103 and third highly doped region 107, thus preventing that the positive pulse voltage, which is greater than the predetermined voltage value, from being directly applied to the internal circuit, thus providing a protection to the internal circuit.

Compared with ESD protection device 100 shown in FIG. 1, ESD protection device 200 shown in FIG. 2 may discharge the excess current through two paths when open, thereby providing a faster electrostatic current discharge to better protect the internal circuit.

In a specific embodiment, referring to FIG. 2, ESD protection device 200 may further include a dummy gate structure 201 on first region 1211 at the distal end (e.g., edge) of first fin 121 that is not covered by the first gate structure to define an opening of first highly doped region 103. In one embodiment, the dummy gate structure may include an interface layer (e.g., silicon oxide layer) on the first region of the first fin that is not covered by the first gate structure, spacers (e.g., an oxide or nitride layer) adjacent to the first fin and the interface layer, a high-k dielectric layer on the interface layer and on the inner sidewalls of the spacers, and a dummy gate (e.g., polysilicon) on the high-k dielectric layer.

In a specific embodiment, referring still to FIG. 2, ESD protection device 200 may further include a dummy gate structure 202 on opposite distal ends of second fin 131 and on shallow trench isolation (STI) region 105 to define an opening of second highly doped region 104. In one embodiment, the dummy gate structure 202 may include an interface layer (e.g., silicon oxide layer) on the second fin, spacers (oxide or nitride layer) adjacent to the STI region and the second fin, a high-k dielectric layer on the interface layer and on the inner sidewalls of the spacers, and a dummy gate (e.g., polysilicon) on the high-k dielectric layer. In an embodiment, dummy gate structure 202 may be formed the same way as first gate structure 102.

An etching process is generally performed on the first fin and the second fin to form first highly doped region 103 and second highly doped region 104, an epitaxial growth process is then performed to form first highly doped region 103 and second highly doped region 104. By forming dummy gate structures 201 and 202, the micro-loading effect that leads to variation of epitaxial growth rates can be reduced.

It should be understood that, when ESD protection device 200 includes third fin 161 and second gate structure 106, a dummy gate structure 203 may be formed on first region 1611 at the distal end (e.g., edge) of third fin 161 that is not covered by the second gate structure, as shown in FIG. 2. Dummy gate structure 203 may be similar to dummy gate structure 201 that has been described in detail above, and therefore, will not be discussed herein for the sake of brevity.

In each of the above-described embodiments, the first gate structure covers at least a portion of the second region of the first fin. FIG. 1 shows that the first gate structure covers a portion of the second region of the first fin, i.e., the first gate structure is on the surface of a portion of the first region and on the surface of a portion of the second region of the first fin. Other embodiments of the first gate structure will be described below in conjunction with FIG. 3 and FIG. 4.

Figure 3:
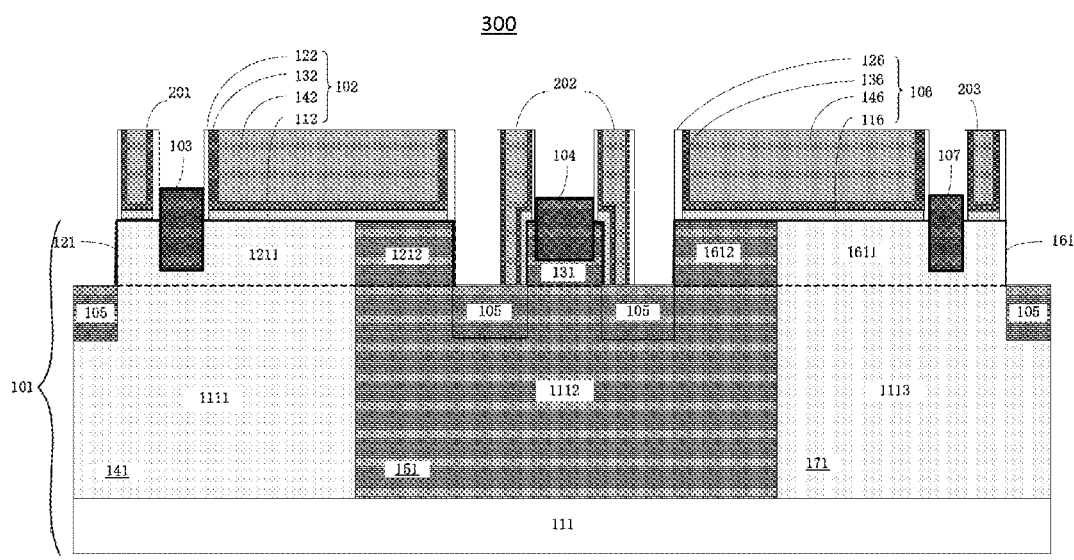
FIG. 3 is a cross-sectional view illustrating an ESD protection device according to yet other embodiments of the present disclosure.

FIG. 3 is a cross-sectional view illustrating an ESD protection device 300 according to yet another embodiment of the present disclosure. As shown in FIG. 3, first gate structure 102 is disposed on a portion of first region 1211 and on second region 1212 of first fin 121, i.e., the surface of second region 1212 of first fin 121 is completely covered by the first gate structure. In addition, second gate structure 106 is disposed on a portion of first area 1611 and the entire upper surface of second area 1612 of third fin 161, as shown in FIG. 3.

Figure 4:
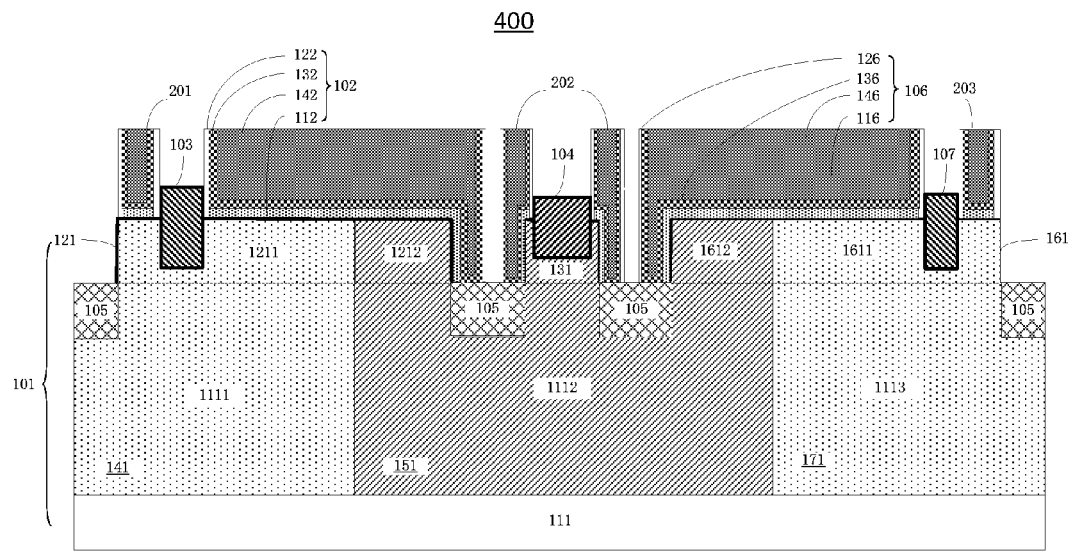
FIG. 4 is a cross-sectional view illustrating an ESD protection device according to still other embodiments of the present disclosure.

FIG. 4 is a cross-sectional view illustrating an ESD protection device 400 according to another embodiment of the present disclosure. As shown in FIG. 4, first gate structure 102 is disposed on the upper surface of a portion of first region 1211, on the entire upper surface and the side surface of second region 1212 of first fin 121, i.e., the first gate structure not only completely covers the upper surface of second region 1212, but also the side surface of second region 1212 of first fin 121. In addition, second gate structure 106 is disposed on the upper surface of a portion of first region 1611 of third fin 161, the upper surface and the side surface of second region 1612 of third fin 161, as shown in FIG. 4.

It is to be understood that, in order to more fully illustrate the structure of the ESD protection device, FIG. 3 and FIG. 4 each show the ESD protection device including a number of elements. However, it is understood that some elements may be optional, such as dummy gate structures 201, 202, and 203.

Embodiments of the present disclosure thus provide ESD protection devices that can be used in a variety of semiconductor devices, in particular in FinFET devices. The ESD protection devices can be manufactured using the conventional FinFET manufacturing processes, and can be used for high voltage ESD protection.

Figure 5:
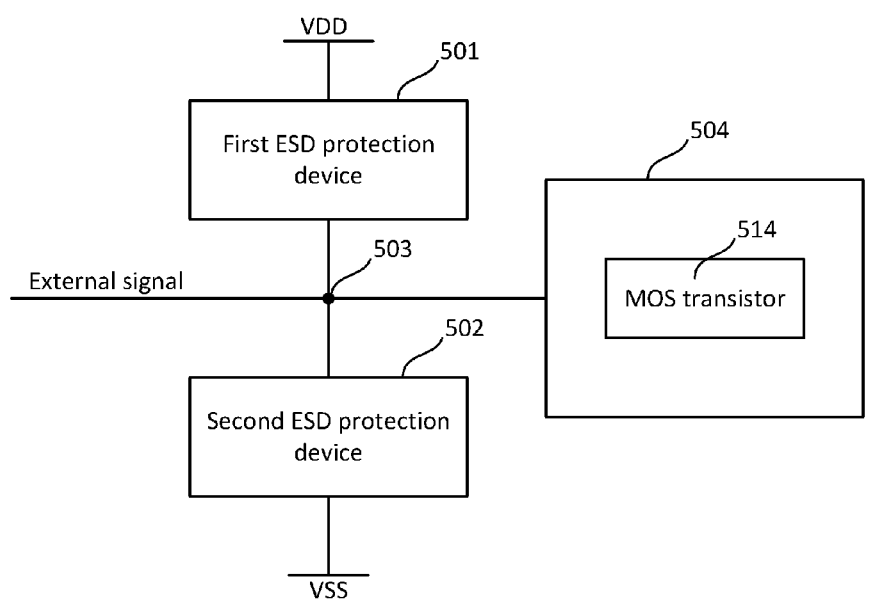
FIG. 5 is a block diagram of a semiconductor device according to embodiments of the present disclosure.

FIG. 5 is a simplified schematic block diagram of a semiconductor device structure 500 according to an embodiment of the present disclosure. As shown in FIG. 5, semiconductor device structure 500 includes a first ESD protection device 501 and a second ESD protection device 502. First ESD protection device 501 and second ESD protection device 502 can be one of the ESD protection devices shown in FIGS. 1 through 4, whose structures have been described in detail above. In first ESD protection device 501, the first doped region is doped with an N-type dopant, the second doped region is doped with a P-type dopant, the first highly doped region and the gate of the first gate structure are electrically connected to the power supply voltage VDD. In second ESD protection device 502, the first doped region is doped with a P-type dopant, the second doped region is doped with an N-type dopant, the first highly doped region and the gate of the first gate structure are electrically connected to the ground potential VSS. Further, the second highly doped region of first ESD protection device 501 is electrically connected to the second highly doped region of second ESD protection device 502, and the second highly doped region of first ESD protection device 501 and the second highly doped region of second ESD protection device 502 are electrically connected to a signal input terminal 503 that is configured to receive an external signal.

In accordance with the present disclosure, since the semiconductor device has first ESD protection device 501 and second ESD protection device 502, when the voltage of the external signal exceeds a predetermined threshold voltage value, the ESD current can be discharged either through first ESD protection device 501 or second ESD protection device 502, thereby preventing static electricity from adversely affecting the performance of the semiconductor device.

In one embodiment, referring to FIG. 5, the semiconductor device may further include an internal circuit 504, the external signal is provided to internal circuit 504 through signal input terminal 503. In a specific embodiment, internal circuit 504 may include a metal oxide semiconductor (MOS) transistor 514; signal input terminal 503 is electrically connected to a gate of the MOS transistor, i.e., the external signal is applied to the gate of MOS transistor 514.

It should be understood that, in some embodiments, the semiconductor device may further include one or other ESD protection devices shown in FIGS. 1 through 4, for example, STI diodes or gated diodes, and the like.

While the present disclosure is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present disclosure could be used to advantage without the corresponding use of other features. As such, the foregoing description should be considered as merely illustrative of the principles of the invention, and not in limitation thereof.

What is claimed is:
1. An electrostatic discharge (ESD) protection device, comprising:
 a substrate structure comprising:
  a semiconductor substrate;
  a plurality of fins on the semiconductor substrate and comprising a first fin and a second fin;
  a first doped region and a second doped region laterally adjacent to each other and having different conductivity types, wherein:
  the first doped region comprises a first portion of the semiconductor substrate and a first region of the first fin on the first portion of the semiconductor substrate,
  the second doped region comprises a second portion of the semiconductor substrate, a second region of the first fin on the second portion of the semiconductor substrate, and the second fin on the second doped region;

a first gate structure on a portion of the first region of the first fin and on a portion of the second region of the first fin;

a first highly doped region in the first region of the first fin and having a same conductivity type as the first doped region, and a dopant concentration of the first highly doped region being higher than a dopant concentration of the first doped region; and a second highly doped region in the second fin and having a same conductivity type as the second doped region, and a dopant concentration of the second highly doped region being higher than a dopant concentration of the second doped region.

2. The ESD protection device of claim 1, further comprising a signal input terminal configured to receive an external signal, wherein the first highly doped region is electrically connected to a gate of the first gate structure, and the second highly doped region is electrically connected to the signal input terminal.

3. The ESD protection device of claim 2, wherein the first doped region is doped with an N-type dopant, the second doped region is doped with a P-type dopant; and the first highly doped region and the gate of the first gate structure are connected to a power supply voltage.

4. The ESD protection device of claim 2, wherein the first doped region is doped with a P-type dopant, the second doped region is doped with an N-type dopant; and the first highly doped region and the gate of the first gate structure are connected to a ground potential.

5. The ESD protection device of claim 1, wherein the first gate structure is disposed on a portion of the first region of the first fin, and on an upper surface and a side surface of the second region of the first fin.

6. The ESD protection device of claim 1, wherein the first gate structure comprises a side surface adjacent to the first highly doped region.

7. The ESD protection device of claim 1, further comprising a shallow trench isolation (STI) region in the second doped region and between two adjacent fins of the plurality of fins.

8. The ESD protection device of claim 7, wherein the first gate structure is disposed on a portion of the first region of the first fin, on an upper surface and a side surface of the second region of the first fin, and on a portion of the STI region.

9. The ESD protection device of claim 7, further comprising:

a dummy gate structure on a distal end portion of the second fin and on the STI region to define an opening in the second highly doped region.

10. The ESD protection device of claim 1, wherein the first gate structure comprises:

an interface layer on the portion of the first region of the first fin and on the portion of the second region of the first fin;

spacers on the first fin and adjacent to opposite sides of the interface layer;

a high-k dielectric layer on the interface layer and on inner sidewalls of the spacers; and a gate on the high-k dielectric layer.

11. The ESD protection device of claim 1, further comprising:

a first dummy gate structure on a distal end portion of the first region of the first fin that is not covered by the first gate structure to define an opening in the first highly doped region.

12. The ESD protection device of claim 11, wherein the first dummy gate structure comprises:

an interface layer on the distal end portion of the first region of the first fin that is not covered by the first gate structure;

first spacers on opposite sides of the first dummy gate structure and adjacent to opposite sides of the interface layer;

a high-k dielectric layer on the interface layer and on inner sidewalls of the first spacers; and a first dummy gate on the high-k dielectric layer.

13. The ESD protection device of claim 12, further comprising a second dummy gate structure, wherein the second dummy gate structure comprises:

the interface layer on opposite distal ends of the second fin;

second spacers on the STI region and on the distal ends of the second fin;

the high-k dielectric layer on the interface layer and on inner sidewalls of the second spacers; and a second dummy gate on the high-k dielectric layer.

14. The ESD protection device of claim 1, wherein the first and second highly doped regions comprise SiGe, SiC, or Si.

15. The ESD protection device of claim 1, wherein:

the plurality of fins further comprises a third fin, the substrate structure further comprises a third doped region adjacent the second doped region, the second and third doped regions having different conductivity types;

the third doped region comprises a third portion of the semiconductor substrate and a first region of the third fin;

the second doped region further comprises a second region of the third fin, the second region of the third fin being adjacent to the first region of the third fin; and the substrate structure further comprises a third highly doped region disposed in the first region of the third fin and having a same conductivity type of the third doped region, and a conductivity type concentration of the third highly doped region higher than a conductivity type concentration of the third doped region.

16. The ESD protection device of claim 15, wherein the first highly doped region is electrically connected to a gate of the first gate structure, and the second highly doped region is electrically connected to a signal input terminal, and the third highly doped region is electrically connected to a gate of a second gate structure.

17. A semiconductor device comprising at least one ESD protection device as recited in claim 1.

18. The semiconductor device of claim 17, wherein the at least one ESD protection device comprises a first ESD protection device and a second ESD protection device, wherein the first doped region of the first ESD protection device comprises an N-type dopant, the second doped region of the first ESD device comprises a P-type dopant, the first highly doped region and a gate of the first gate structure of the first ESD protection device are electrically connected to a power supply voltage;

wherein the first doped region of the second ESD protection device comprises a P-type dopant, the second doped region of the second ESD protection device comprises an N-type dopant, the first highly doped region and a gate of the first gate structure of the second ESD protection device are electrically connected to a ground potential;

wherein the second highly doped region of the first ESD protection device is electrically connected to the second highly doped region of the second ESD protection device, and the second highly doped region of the first ESD protection device and the second highly doped region of the second ESD protection device are connected to a signal input terminal configured to receive an external signal.

19. The semiconductor device of claim 18, further comprising an internal circuit electrically connected to the signal input terminal for receiving the external signal.

20. The semiconductor device of claim 19, wherein the internal circuit comprises a metal oxide semiconductor (MOS) transistor having a gate connected to the signal input terminal.

* * * * *